(12) United States Patent
Luo et al.

(10) Patent No.: US 10,824,198 B2
(45) Date of Patent: Nov. 3, 2020

(54) FUNCTION PANEL, MANUFACTURING METHOD THEREOF AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Hongqiang Luo, Beijing (CN); Jianjun Wu, Beijing (CN); KwangGyun Jang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan Province (CN)

( * ) Notice: Subject to any disclaimer, the term of this patent is extended or adjusted under 35 U.S.C. 154(b) by 0 days.

(21) Appl. No.: 16/100,359

(22) Filed: Aug. 10, 2018

(65) Prior Publication Data
US 2019/0129472 A1 May 2, 2019

(30) Foreign Application Priority Data
Oct. 26, 2017 (CN) .......................... 2017 1 1022130

(51) Int. Cl.
*G06F 1/16* (2006.01)
*H05K 3/32* (2006.01)
(Continued)

(52) U.S. Cl.
CPC ........ *G06F 1/1643* (2013.01); *G06F 3/04164* (2019.05); *H05K 1/189* (2013.01);
(Continued)

(58) Field of Classification Search
CPC ................. G06F 3/0412; G06F 3/044–0448
See application file for complete search history.

(56) References Cited

U.S. PATENT DOCUMENTS

2003/0164919 A1* 9/2003 Oh ...................... G02F 1/13452
349/149
2006/0220991 A1* 10/2006 Lee ...................... G02F 1/13452
345/52
(Continued)

FOREIGN PATENT DOCUMENTS

CN 1412614 A 4/2003
CN 1862327 A 11/2006
(Continued)

OTHER PUBLICATIONS

First office action of Chinese application No. 201711022130.5 dated Oct. 18, 2019.
(Continued)

*Primary Examiner* — Hang Lin
(74) *Attorney, Agent, or Firm* — Fay Sharpe LLP

(57) ABSTRACT

A function panel, a manufacturing method thereof and a display device are provided. The function panel is in the display device, and includes: a base substrate, a plurality of conductive structures and a plurality of bonding structures on the base substrate, the plurality of conductive structures being connected with the plurality of bonding structures in one-to-one correspondence; and a core obstructing structure being provided on each of the bonding structures for obstructing overflow of conductive particles in an anisotropic conductive film. By providing the core obstructing structure on the bonding structure, the core obstructing structure can obstruct overflow of the conductive particles in the anisotropic conductive film. After the display device is formed, an overall width of the frame of the display device can be reduced effectively.

20 Claims, 14 Drawing Sheets

(51) Int. Cl.
*H05K 1/18* (2006.01)
*G06F 3/041* (2006.01)
*G02F 1/1345* (2006.01)
*G06F 3/044* (2006.01)

(52) U.S. Cl.
CPC ......... *H05K 3/323* (2013.01); *G02F 1/13452* (2013.01); *G06F 3/0412* (2013.01); *G06F 3/0446* (2019.05); *G06F 2203/04103* (2013.01)

(56) References Cited

U.S. PATENT DOCUMENTS

| | | | |
|---|---|---|---|
| 2007/0268441 A1* | 11/2007 | Liu | G02F 1/13452 349/149 |
| 2011/0205716 A1 | 8/2011 | Moriwaki | |
| 2017/0285779 A1* | 10/2017 | Ryu | G06F 3/041 |

FOREIGN PATENT DOCUMENTS

| | | |
|---|---|---|
| CN | 102203840 A | 9/2011 |
| CN | 104007866 A | 8/2014 |
| CN | 107272934 A | 10/2017 |

OTHER PUBLICATIONS

Second office action of Chinese application No. 201711022130.5 dated Jul. 3, 2020.

\* cited by examiner front of the display device will not be too large.

At present, in narrow frame display devices, it is possible to realize the left and right narrow frames (the distance from the display area to the left border is less than 1 mm, and the distance from the display area to the right border is less than 1 mm), but the width of at least one of the upper and lower frames of the narrow frame display device is still large. Therefore, the overall narrow frame of the display device still cannot be realized.

FUNCTION PANEL, MANUFACTURING METHOD THEREOF AND DISPLAY DEVICE

This application claims priority to Chinese Patent Application No. 201711022130.5, filed with the State Intellectual Property Office on Oct. 26, 2017 and titled "FUNCTION PANEL, MANUFACTURING METHOD THEREOF AND DISPLAY DEVICE", the entire contents of which are incorporated herein by reference.

TECHNICAL FIELD

The present disclosure relates to a function panel, a manufacturing method thereof and a display device.

BACKGROUND

In recent years, the development of display devices such as cell phones which have a touch display function is growing faster and faster. Display devices have gradually become a necessity for people. In order to improve the level of comfort for a user using the display device, the screen size of the display device is becoming larger and larger, and the overall size of the display device is also increased along with the increase of the screen size. However, if the overall size of the display device exceeds a certain dimension, the using effect of the user will be influenced, and the visual effect of the user will also be influenced. Therefore, there is a need to reduce the frame around the screen so that the overall size of the display device will not be too large.

SUMMARY

The present disclosure provides a function panel, a manufacturing method thereof and a display device.

In a first aspect, there is provided a function panel, comprising: a base substrate; a plurality of conductive structures and a plurality of bonding structures provided on the base substrate, the plurality of conductive structures being connected with the plurality of bonding structures in one-to-one correspondence; and a core obstructing structure provided on each of the bonding structures for obstructing overflow of conductive particles in an anisotropic conductive film.

Optionally, the core obstructing structure comprises: a plurality of pore-like structures, a width of each of the pore-like structures being smaller than a diameter of the conductive particle.

Optionally, the width of each of the pore-like structures is equal to one third of the diameter of the conductive particle.

Optionally, the pore-like structures are blind holes.

Optionally, the core obstructing structure comprises: protruding structures provided at two sides of the bonding structure, a height of the protruding structure being smaller than a diameter of the conductive particle.

Optionally, the height of the protruding structure is equal to one third of the diameter of the conductive particle.

Optionally, when the function panel is a touch panel, the plurality of conductive structures are a plurality of touch electrodes, which are connected with the plurality of bonding structures in one-to-one correspondence.

Optionally, when the function panel is an array substrate, the plurality of conductive structures are a plurality of signal lines, which are connected with the plurality of bonding structures in one-to-one correspondence.

Optionally, each of the bonding structures comprises: a first indium tin oxide layer, a metal layer and a second indium tin oxide layer which are stacked in sequence; the metal layer is provided with a plurality of first via holes, the second indium tin oxide layer is provided with a plurality of second via holes, and the first via holes are communicated with the second via holes in one-to-one correspondence.

Optionally, each of the bonding structures comprises: a first indium tin oxide layer, a metal layer and a second indium tin oxide layer which are stacked in sequence; the protruding structures are provided at two sides of the second indium tin oxide layer.

In a second aspect, there is provided a manufacturing method of a function panel, comprising the steps of: forming a plurality of conductive structures and a plurality of bonding structures on a base substrate, wherein the plurality of conductive structures are connected with the plurality of bonding structures in one-to-one correspondence; and providing a core obstructing structure on each of the bonding structures for obstructing overflow of conductive particles in an anisotropic conductive film.

Optionally, the core obstructing structure comprises: a plurality of pore-like structures; the step of forming a plurality of conductive structures and a plurality of bonding structures on a base substrate includes the steps of: forming the plurality of conductive structures and a plurality of original bonding structures on the base substrate, and processing the plurality of original bonding structures using a one-time patterning technology to form the plurality of bonding structures, wherein a width of each of the pore-like structures is smaller than a diameter of the conductive particle.

Optionally, the core obstructing structure comprises: protruding structures provided at two sides of the bonding structure; the step of forming a plurality of conductive structures and a plurality of bonding structures on a base substrate includes the steps of: forming the plurality of conductive structures and a plurality of original bonding structures on the base substrate, and processing the plurality of original bonding structures using a one-time patterning technology to form the plurality of bonding structures, wherein a height of the protruding structure is smaller than a diameter of the conductive particle.

Optionally, the step of forming a plurality of conductive structures and a plurality of bonding structures on a base substrate includes the step of: forming a plurality of touch electrodes and the plurality of bonding structures on the base substrate when the function panel is a touch panel, wherein, the plurality of touch electrodes are connected with the plurality of bonding structures in one-to-one correspondence.

Optionally, the step of forming a plurality of conductive structures and a plurality of bonding structures on a base substrate includes the step of: forming a plurality of signal lines and the plurality of bonding structures on the base substrate when the function panel is an array substrate, wherein the plurality of signal lines are connected with the plurality of bonding structures in one-to-one correspondence.

In a third aspect, there is provided a display device, comprising: a function panel, a flexible circuit board and an anisotropic conductive film, wherein the function panel comprises: a base substrate; a plurality of conductive structures and a plurality of bonding structures provided on the base substrate, the plurality of conductive structures being connected with the plurality of bonding structures in one-to-one correspondence; and a core obstructing structure provided on each of the bonding structures for obstructing overflow of conductive particles in an anisotropic conductive film, wherein the bonding structures in the function panel are connected to the flexible circuit board by the anisotropic conductive film.

Optionally, the core obstructing structure comprises: a plurality of pore-like structures, a width of each of the pore-like structures being smaller than a diameter of the conductive particle.

Optionally, the width of each of the pore-like structures is equal to one third of the diameter of the conductive particle.

Optionally, the pore-like structures are blind holes.

Optionally, the core obstructing structure comprises: protruding structures provided at two sides of the bonding structure, a height of the protruding structure being smaller than a diameter of the conductive particle.

DETAILED DESCRIPTION

To make the principle and advantages of the present disclosure clearer, the following will give a further detailed description of the embodiments of the present disclosure in combination with the drawings.

Figure 1:
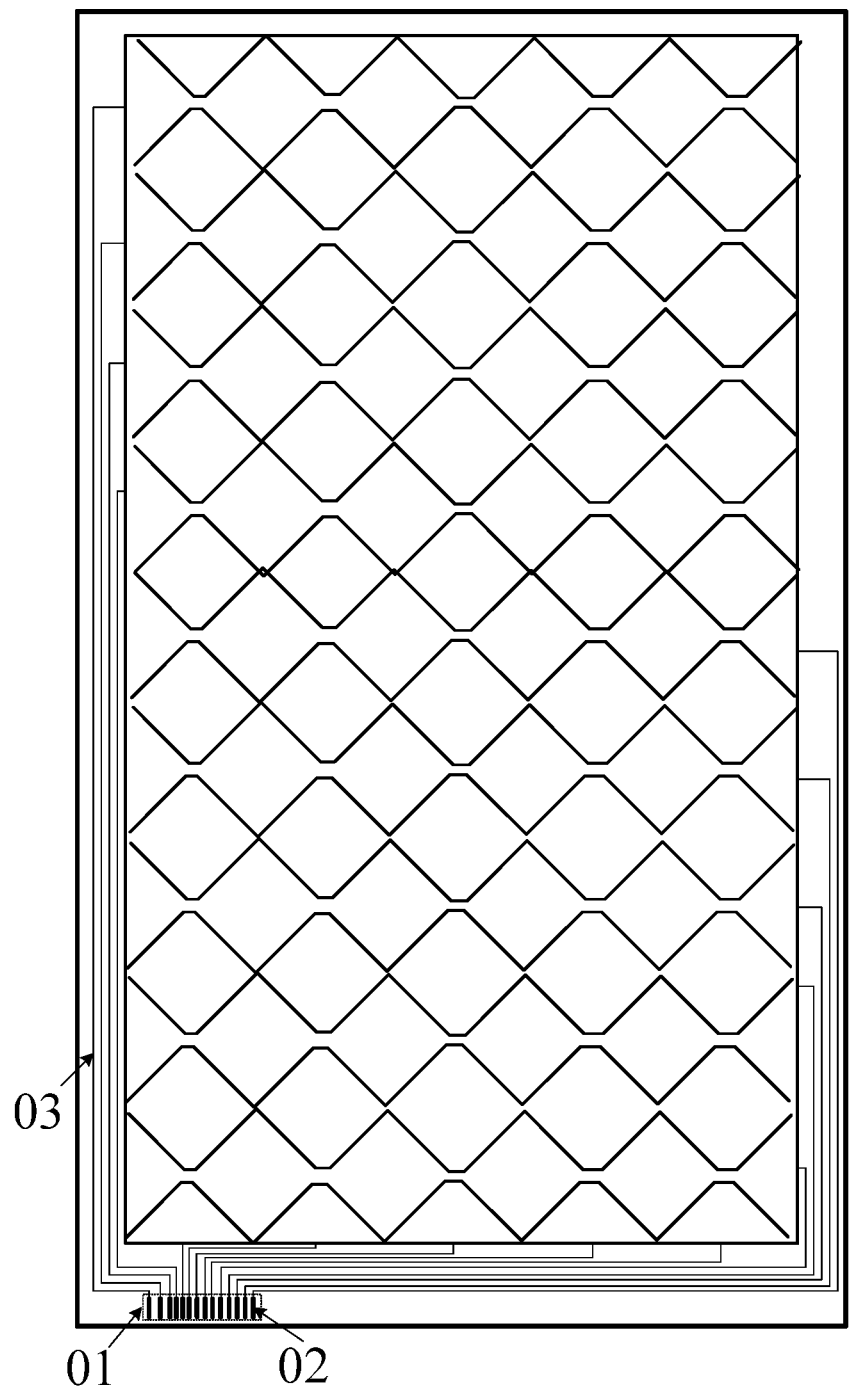
FIG. 1 is a schematic diagram of a structure of a touch panel in a narrow frame display device which is known by the inventor(s)

FIG. 1 is a schematic diagram of a structure of a touch panel in a narrow frame display device which is known by the inventor(s). In order to enable the touch panel to have a touch function, both the touch drive electrode and touch sensing electrode provided inside the touch panel need to be connected to a touch chip. In general, the touch chip can be printed on a flexible printed circuit (referred to as FPC) on which a metal connecting structure can be provided. A bonding area 01 can be formed on at least one edge of an upper edge and a lower edge of the touch panel.

Figure 2:
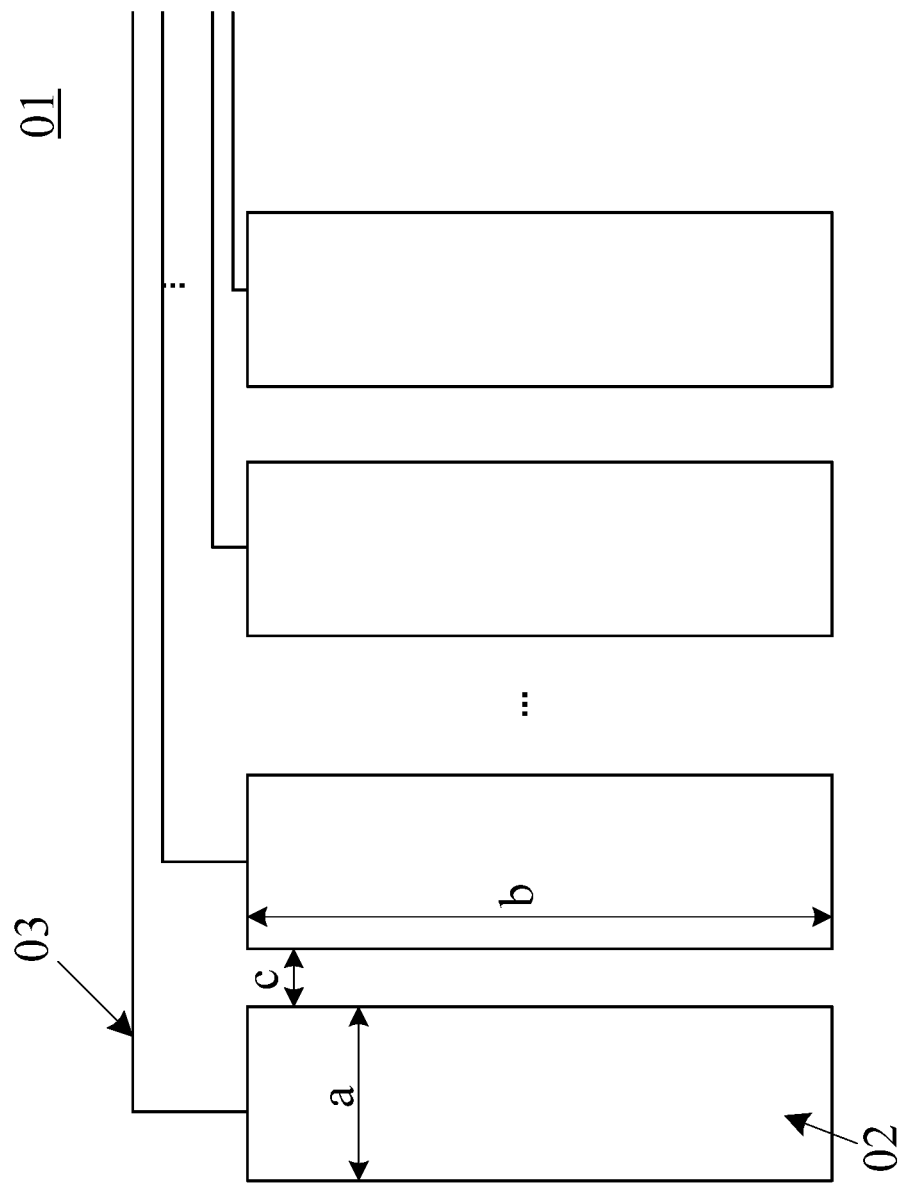
FIG. 2 is a local enlarged view of the bonding area in the touch panel in FIG. 1.

FIG. 2 is a local enlarged view of the bonding area in the touch panel in FIG. 1. A plurality of bonding structures 02 can be provided on the bonding area 01, and a plurality of signal wires 03 can be provided in the touch panel as well. A bonding structure 02 can be connected to a touch drive electrode by a signal wire 03, or, a bonding structure 02 is connected to a touch sensing electrode by a signal wire 03. The bonding structure 02 on the bonding area 01 can be connected to the metal connecting structure on the FPC by an anisotropic conductive film (referred to as ACF), thereby realizing a connection between the touch drive electrode and the touch chip in the touch panel and a connection between the touch sensing electrode and the touch chip in the touch panel.

Figure 3:
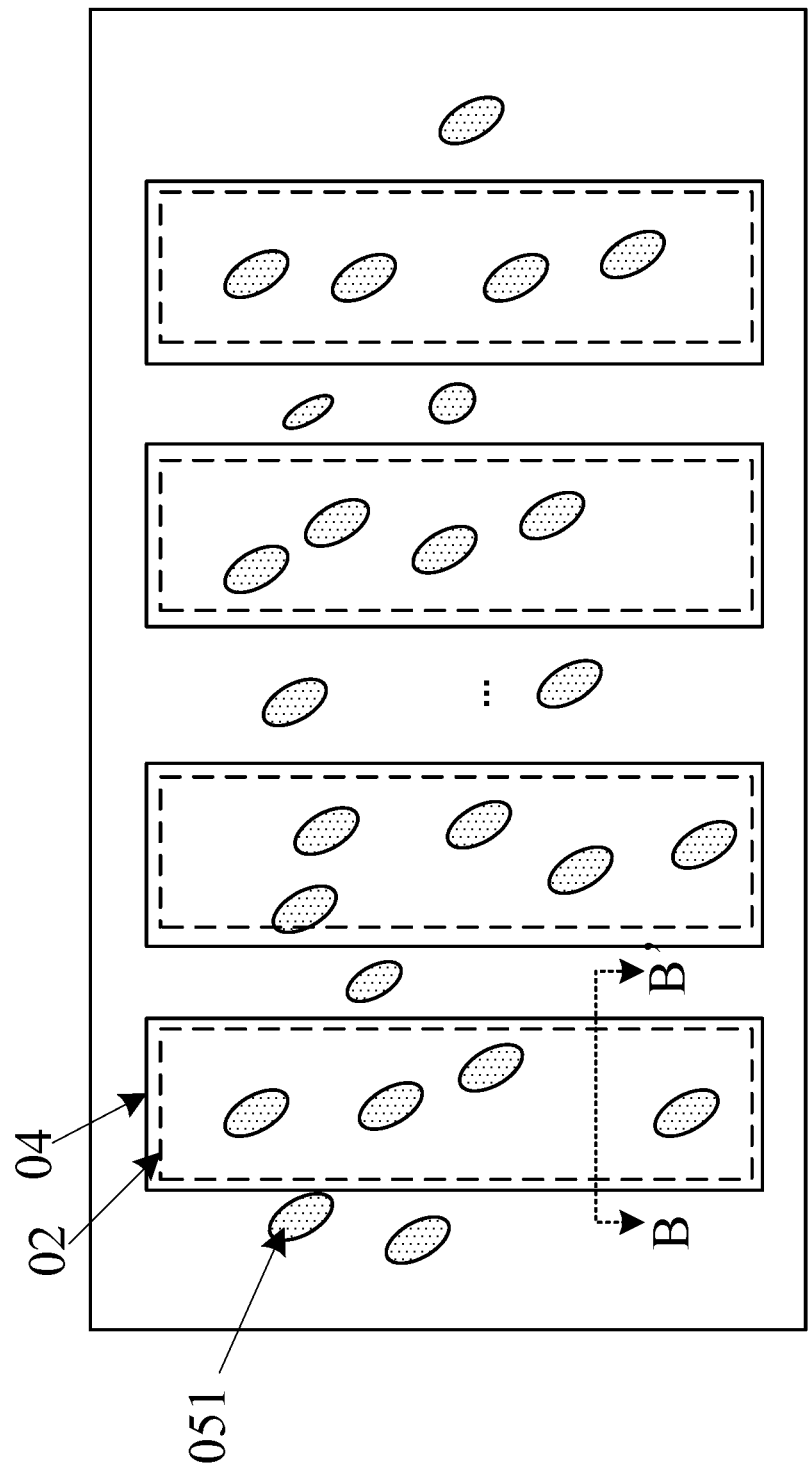
FIG. 3 is a top view of a bonding structure when being connected with a metal connecting structure which is known by the inventor.
Figure 4:
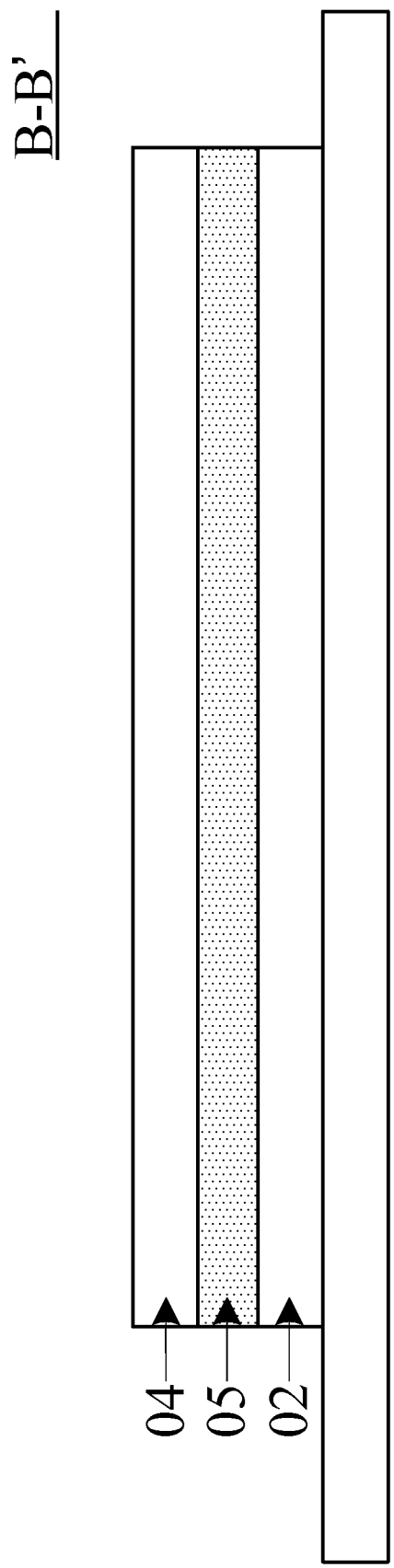
FIG. 4 is a sectional view at B-B' in FIG. 3.

Please refer to FIGS. 3 and 4. FIG. 3 is a top view of the bonding structure when being connected with the metal connecting structure. FIG. 4 is a sectional view at B-B' in FIG. 3. In the process of connecting the bonding structure 02 with the metal connecting structure 04 by the ACF 05, a certain ACF reaction temperature is required, and an appropriate pressure needs to be applied to the metal connecting structure 04.

Figure 5:
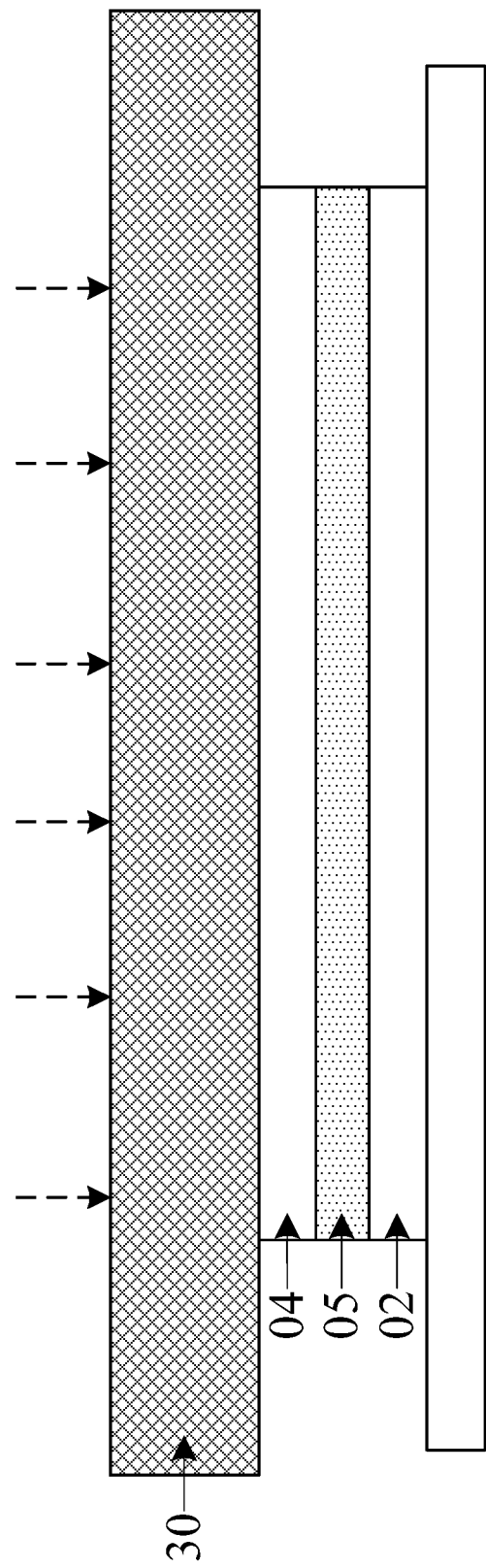
FIG. 5 is a diagram of the effect of applying a pressure to the metal connecting structure when the bonding structure is connected with the metal connecting structure in FIG. 4.

FIG. 5 is a diagram of the effect of applying a pressure to the metal connecting structure when the bonding structure is connected with the metal connecting structure in FIG. 4. As shown in FIG. 5, for example, a pressure head 30 can be employed to apply an appropriate pressure to the metal connecting structure 04. Since the bonding structure 02 and the metal connecting structure 04 in the FPC both have a smooth surface, under the ACF reaction temperature, conductive particles 051 in the ACF 05 are in a flow state. Thus, when the pressure head 30 is employed to apply a pressure to the metal connecting structure 04, the conductive particles 051 in the ACF 05 can flow into a gap between two adjacent bonding structures 02. If at least one of the length and width of the bonding structure 02 is too small, when the pressure head 30 is employed to apply a pressure to the metal connecting structure 04, this may cause all the conductive particles 051 in the ACF 05 to flow into the gap between two adjacent bonding structures 02, thereby making it impossible to realize an electrical connection between the bonding structure 02 and the metal connecting structure 04.

Therefore, in order to ensure the electrical connection between the bonding structure 02 and the metal connecting structure 04, there is a need to increase the length and width of the bonding structure 02. As a result, the width of the bonding area 01 is large, and thus needs to be shielded by a housing when the narrow frame display device is formed. As such, in the current narrow frame display devices, at least one of the upper frame (i.e., the distance from the display area to the upper border) and the lower frame (i.e., the distance from the display area to the lower border) has a large width.

Similarly, in order to enable the display device with a narrow frame to have a display function, the signal lines (which may include: gate lines and data lines) in the display panel of the narrow frame display device need to be connected to a display chip, and thus the bonding structures can be provided in the display panel. Likewise, in order to ensure the electrical connection between the bonding structure and the FPC provided with the display chip, there is a need to increase the length and width of the bonding structure, and in this way, when the narrow frame display device is formed, at least one of the upper and lower frames of the display device with the narrow frame will have a large width.

Therefore, the overall narrow frame is still unable to be achieved for the current display devices.

The embodiments of the present disclosure provide a function panel capable of realizing an overall narrow frame of a display device. The function panel is positioned in the display device and can comprise: a base substrate; a plurality of conductive structures and a plurality of bonding structures provided on the base substrate, the plurality of conductive structures being connected with the plurality of bonding structures in one-to-one correspondence; and a core obstructing structure provided on each of the bonding structures for obstructing overflow of conductive particles in an anisotropic conductive film.

In summary, according to the touch panel provided by the embodiment of the present disclosure, the core obstructing structure is provided on each bonding structure in the function panel. When the bonding structure is connected to the FPC by the ACF, under the reaction temperature of the ACF, after a pressure is applied to the FPC, the core obstructing structure provided on the bonding structure can obstruct overflow of the conductive particles in the ACF. Thus, the length of the bonding structure can be reduced, allowing the bonding area formed by the bonding structure to have a smaller width. Consequently, after the display device is formed, an overall width of the frame of the display device can be reduced effectively.

In the embodiments of the present disclosure, the function panel can be a touch panel, and can also be an array substrate. When the function panel is a touch panel, the plurality of conductive structures is a plurality of touch electrodes, which is connected to the plurality of bonding structures in one-to-one correspondence; when the function panel is an array substrate, the plurality of conductive structures are a plurality of signal lines, which are connected to the plurality of bonding structures in one-to-one correspondence. In order to facilitate detailed descriptions of the structures of the touch panel and the array substrate, it is assumable that the base substrate in the touch panel is a first base substrate and the bonding structure in the touch panel is a first bonding structure, and that the base substrate in the array substrate is a second base substrate and the bonding structure in the array substrate is a second bonding structure. The embodiments of the present disclosure provide respective detailed descriptions to the structure and manufacturing method of the touch panel and the structure and manufacturing method of the array substrate from the following two aspects.

Figure 6:
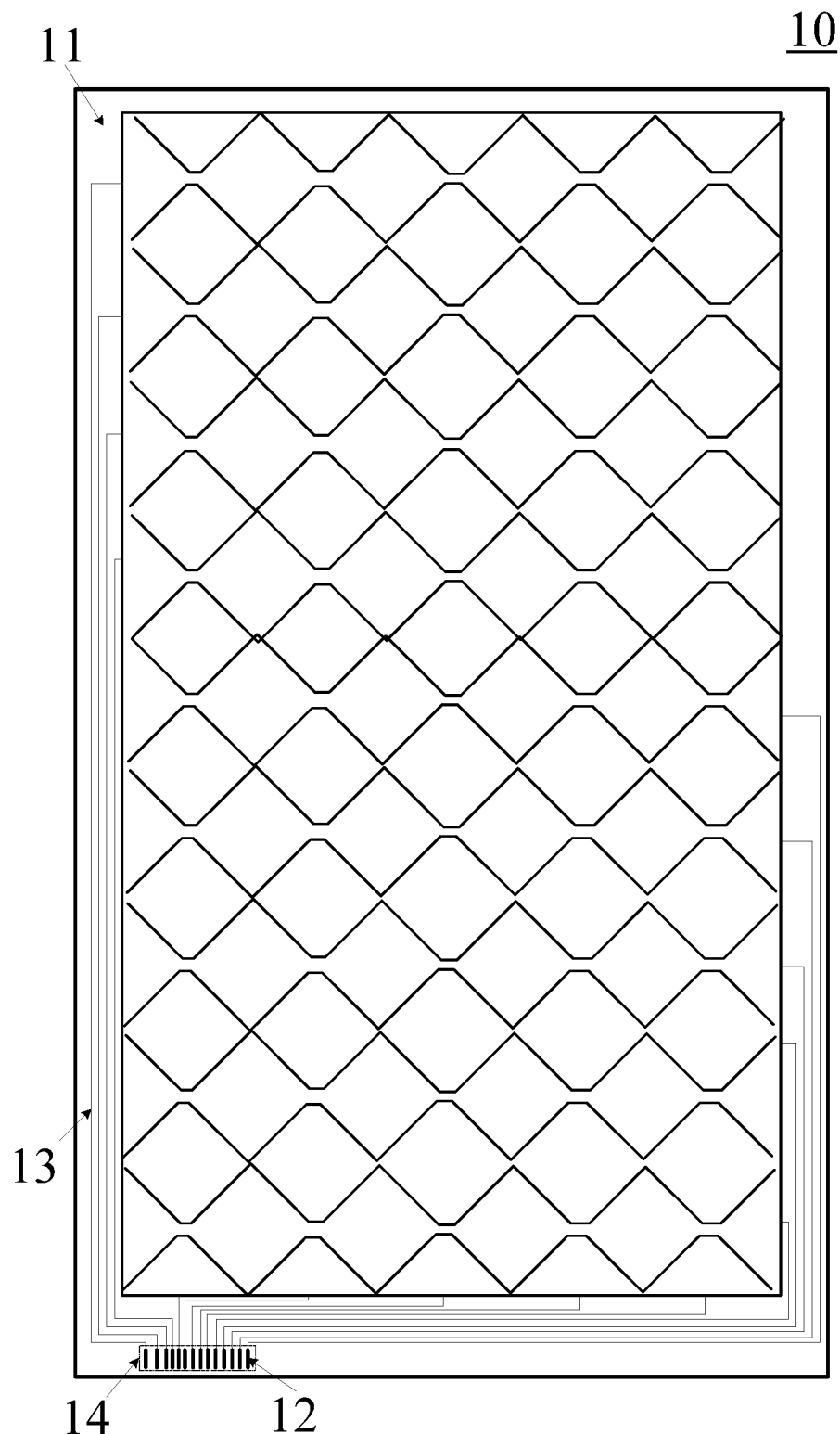
FIG. 6 is a schematic diagram of a structure of a touch panel according to an embodiment of the present disclosure.

In the first aspect, when the function panel is a touch panel, please refer to FIG. 6. FIG. 6 is a schematic diagram of a structure of the touch panel 10 provided by an embodiment of the present disclosure. The touch panel 10 can include: a first base substrate 11. A plurality of touch electrodes (not shown in FIG. 6) and a plurality of first bonding structures 12 are provided on the first base substrate 11, the plurality of touch electrodes being connected with the plurality of first bonding structures 12 in one-to-one correspondence.

Optionally, the touch panel 10 can further include: a plurality of signal wires 13 which are in one-to-one correspondence with the plurality of bonding structures 12. A touch electrode is connected to a corresponding first bonding structure 12 by a signal wire 13. The plurality of bonding structures 12 can be formed in a first bonding area 14, and the touch electrode can include a touch drive electrode and a touch sensing electrode.

Each of the first bonding structures 12 is provided with a core obstructing structure (not shown in FIG. 6), which is used for obstructing overflow of conductive particles in the ACF.

In summary, according to the touch panel provided by the embodiment of the present disclosure, the core obstructing structure is provided on each of the first bonding structures in the touch panel. When the first bonding structure is connected to the first FPC by the ACF, under the reaction temperature of the ACF, after a pressure is applied to the first FPC, the core obstructing structure provided on the first bonding structure can obstruct overflow of the conductive particles in the ACF. Thus, the length of the first bonding structure can be reduced, allowing the first bonding area formed by the first bonding structure to have a smaller width. Consequently, after the display device is formed, an overall width of the frame of the display device can be reduced effectively.

In the embodiment of the present disclosure, the core obstructing structure provided on the first bonding structure has a plurality of implementations, and the embodiment of the present disclosure takes the following two implementations as examples to make an illustrative description.

Figure 7:
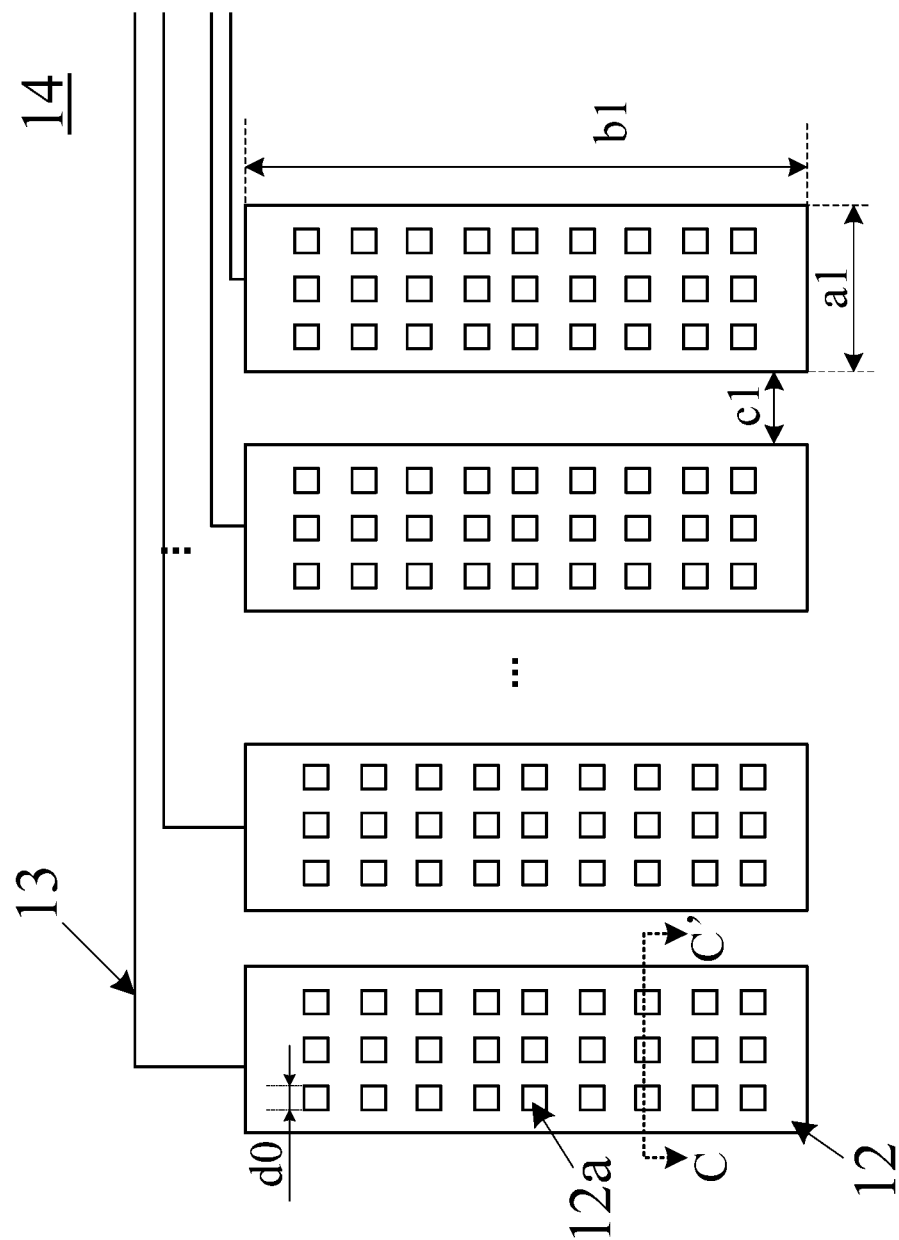
FIG. 7 is a local enlarged view of a first bonding area according to an embodiment of the present disclosure.
Figure 8:
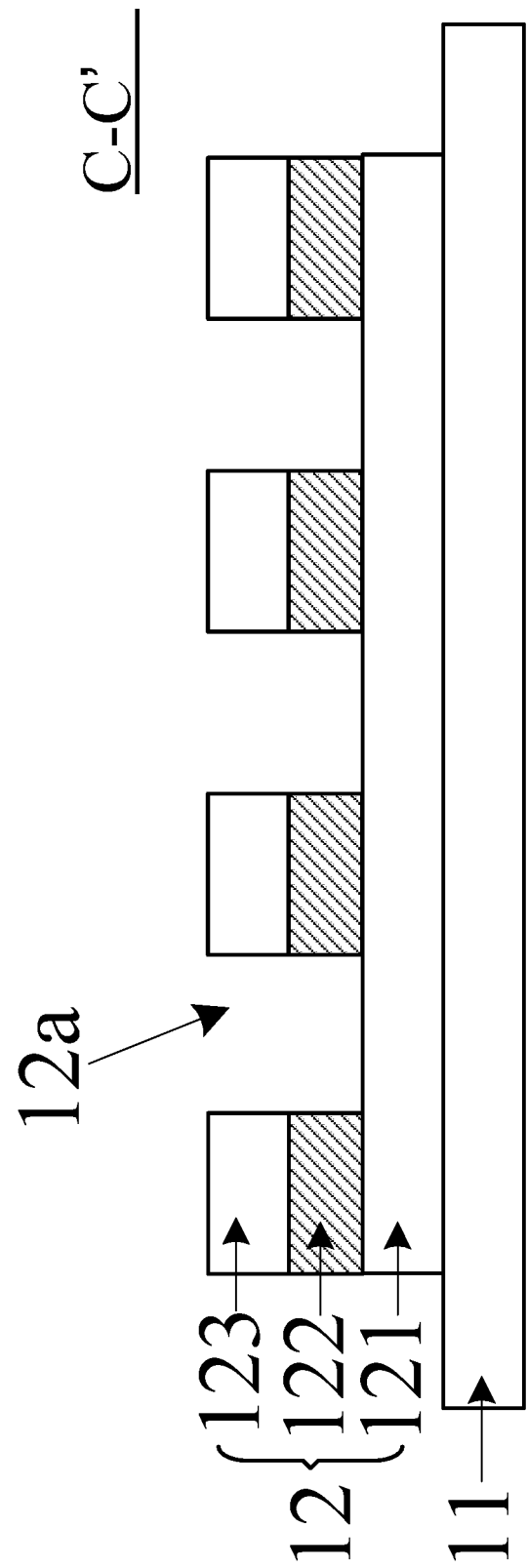
FIG. 8 is a sectional view of the first bonding area along C-C' in FIG. 7.

For the first implementation, please refer to FIGS. 7 and 8. FIG. 7 is a local enlarged view of a first bonding area 14 provided by an embodiment of the present disclosure, and FIG. 8 is a sectional view of the first bonding area 14 along C-C' in FIG. 7. The core obstructing structure provided on each of the first bonding structures 12 can include: a plurality of pore-like structures 12a provided on the first bonding structure 12. A width $d_0$ of each pore-like structure 12a is smaller than a diameter of the conductive particle in the ACF. Optionally, the width $d_0$ of each pore-like structure 12a is equal to one third of the diameter of the conductive particle.

Figure 9:
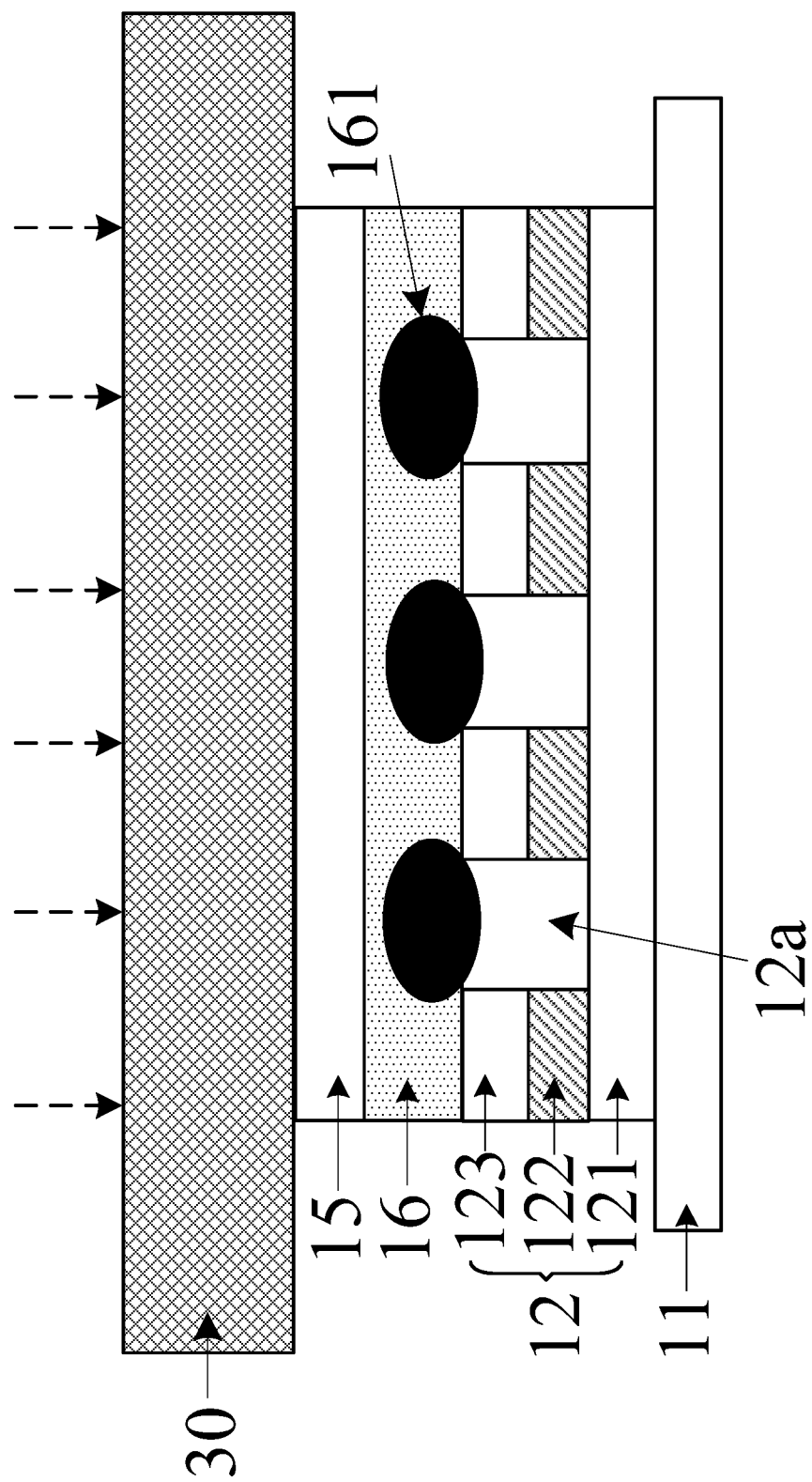
FIG. 9 is a diagram of the effect of connecting the first bonding structure with a first FPC according to an embodiment of the present disclosure.

Exemplarily, please refer to FIG. 9, which is a diagram of the effect of connecting the first bonding structure with a first FPC provided by an embodiment of the present disclosure. The first FPC is provided with a plurality of first metal connecting structures 15. When the plurality of first metal connecting structures 15 are electrically connected with the plurality of first bonding structures 12 in one-to-one correspondence, it is possible to realize the electrical connections between the plurality of first bonding structures 12 and the first FPC. Exemplarily, an ACF 16 can be adopted to realize the electrical connections between the plurality of first bonding structures 12 and the first FPC. For example, under the ACF reaction temperature, after a certain pressure is applied to the first FPC by using the pressure head 30, conductive particles 161 in the ACF 16 are in a flow state under the ACF reaction temperature, however, since each of the first bonding structures 12 is provided with a plurality of pore-like structures 12a, the conductive particles 161 are caused to be stuck in the plurality of pore-like structures 12a, thereby effectively avoiding overflow of the conductive particles 161 from the ACF 16. Therefore, the length of the first bonding structure 12 can be reduced, which will not influence the electrical connection between the first bonding structure 12 and the first metal connecting structure 15.

For example, assume that the size of the touch panel is 5.99 inches, as shown in FIG. 2, a width of the bonding structure 02 is a=0.1 millimeter (mm), a length of the bonding structure 02 is b=1.2, and a gap between every two adjacent bonding structures 02 is c=0.1 mm. In the embodiment of the present disclosure as shown in FIG. 7, a width of the first bonding structure 12 is a1=0.03 mm, a length of the first bonding structure 12 is b1=0.6 mm, and a gap between every two adjacent first bonding structures 12 is c1=0.03 mm. Therefore, the adoption of the touch panel in the embodiment of the present disclosure as shown in FIG. 7 can reduce not only the length of the first bonding structure, but also the width of the first bonding structure and the gap between every two adjacent first bonding structures. When at least one of the width of the first bonding structure and the gap between every two adjacent first bonding structures is smaller, the subsequent amount of ACF can be reduced, and the width of the first FPC can be decreased as well, thus the costs for manufacturing the display device can be effectively reduced.

Optionally, the pore-like structures are blind holes. When the pore-like structures provided on the first bonding structure are blind holes, under the ACF reaction temperature, after a certain pressure is applied to the first FPC by using the pressure head, it is possible to prevent the conductive particles from being extruded into the pore-like structures, which causes the conductive particles to contact only with the first bonding structure and unable to contact with the first metal connecting structure. Therefore, when the pore-like structures are blind holes, it is possible to ensure that the conductive particles are always in contact with the first bonding structure and the first metal connecting structure, respectively, thus a conductivity between the first bonding structure and the first metal connecting structure can be effectively improved.

Optionally, as shown in FIG. 8, each of the first bonding structures 12 can include: a first indium tin oxide layer 121, a metal layer 122 and a second indium tin oxide layer 123 which are stacked in sequence on the first base substrate 11. The metal layer 122 can be provided with a plurality of via holes, and the second indium tin oxide layer 123 can be provided with a plurality of second via holes, the plurality of first via holes being communicated with the plurality of second via holes in one-to-one correspondence, so that a plurality of pore-like structures 12a can be formed on the first bonding structure 12. Provision of the metal layer 122 in the first bonding structure 12 can improve the conductivity of the first bonding structure 12.

In general situations, the materials of the touch drive electrode and touch sensing electrode in the touch panel are both indium tin oxide. In order to improve the conductivity between the first bonding structure and the touch electrode (i.e., touch drive electrode and touch sensing electrode), the material of the signal wire used for connection between the first bonding structure and the touch electrode can be a metal. The touch electrode in the touch panel can be formed simultaneously with the first bonding structure. For example, the first indium tin oxide layer is formed at the same time when the touch sensing electrode is formed; the metal layer is formed at the same time when the signal wire is formed; and the second indium tin oxide layer is formed at the same time when the touch drive electrode is formed. It should be noted that the embodiment of the present disclosure makes an illustrative description by taking the first bonding structure comprising two indium tin oxide layers and one metal layer as an example. In an alternative embodiment, the first bonding structure can include one indium tin oxide layer and one metal layer, or, the first bonding layer only includes one metal layer. The embodiment of the present disclosure does not make any specific definitions to the type of the first bonding structure.

Figure 10:
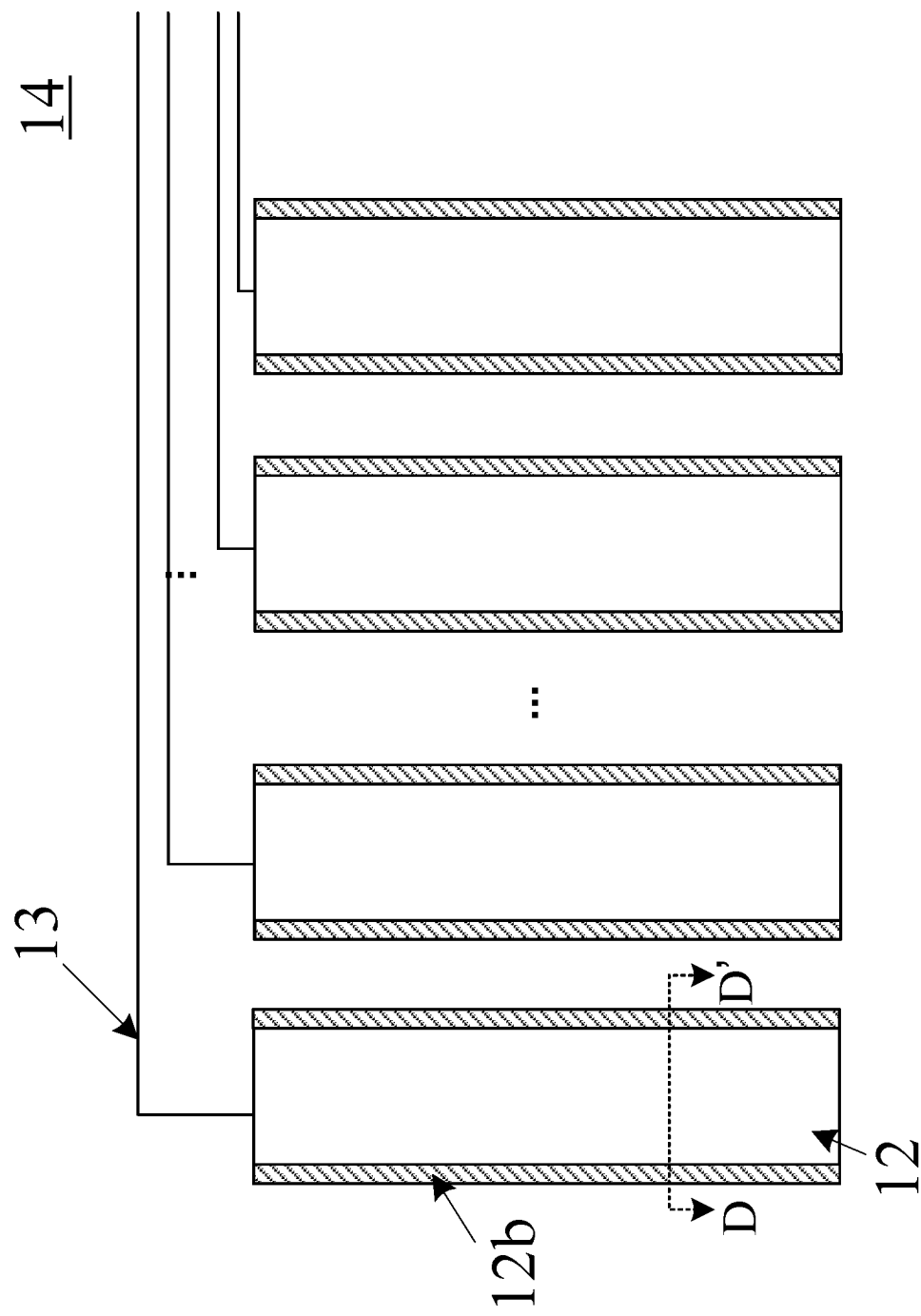
FIG. 10 is a local enlarged view of another first bonding area according to an embodiment of the present disclosure.
Figure 11:
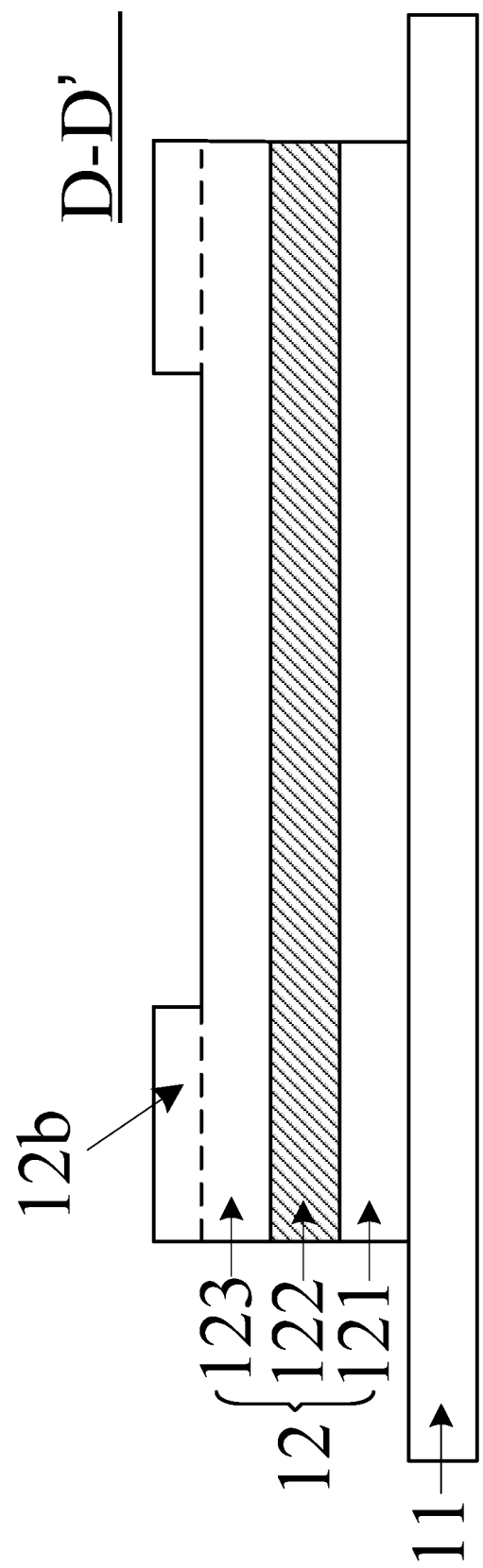
FIG. 11 is a sectional view of the first bonding area along D-D' in FIG. 10.

For the second implementation, please refer to FIGS. 10 and 11. FIG. 10 is a local enlarged view of another first bonding area 14 provided by an embodiment of the present disclosure, and FIG. 11 is a sectional view of the first bonding area 14 along D-D' in FIG. 10. The core obstructing structure provided on each of the first bonding structures 12 can include: protruding structures 12b provided at two sides of the first bonding structure 12, a height of which protruding structure 12b is smaller than a diameter of the conductive particle. Optionally, the height of the protruding structure 12b is equal to one third of the diameter of the conductive particle. Provision of the protruding structures 12b at two sides of the first bonding structure 12 can also effectively avoid overflow of the conductive particles from the ACF, and thus the length of the first bonding structure 12 can be reduced. It should be noted that reference can be made to the corresponding contents in the first implementation for the principle of reduction of the length of the first bonding structure in the second implementation, and the embodiment of the present disclosure will not provide a description thereof any more.

Optionally, as shown in FIG. 11, each of the first bonding structures 12 includes a first indium tin oxide layer 121, a metal layer 122 and a second indium tin oxide layer 123 which are stacked in sequence on the first base substrate 11. The protruding structures 12b can be provided at two sides of the second indium tin oxide layer 123, and the material of the protruding structures 12b is the same as that of the second indium tin oxide layer. It should be noted that, reference can be made to the corresponding contents in the first implementation for the specific film layer structure of the first bonding structure in the second implementation, and the embodiment of the present disclosure will not provide a description thereof any more.

In summary, the touch panel provided by the embodiment of the present disclosure provides the core obstructing structure on each of the first bonding structures in the touch panel. When the first bonding structure is connected to the first FPC by the ACF, under the reaction temperature of the ACF, after a pressure is applied to the first FPC, the core obstructing structure provided on the first bonding structure can obstruct overflow of the conductive particles in the ACF. Thus, the length of the first bonding structure can be reduced, allowing the first bonding area formed by the first bonding structure to have a smaller width. Consequently, after the display device is formed, an overall width of the frame of the display device can be reduced effectively. Moreover, the width of the first bonding structure and the gap between every two adjacent first bonding structures can also be reduced, thus the amount of ACF used subsequently can be reduced, and the width of the first FPC can be decreased, and thereby the costs for manufacturing the display device can be reduced effectively.

The embodiments of the present disclosure further provide a manufacturing method of the touch panel, which can comprise the following steps.

A plurality of touch electrodes and a plurality of first bonding structures are formed on a first base substrate.

Herein, the plurality of touch electrodes are connected with the plurality of first bonding structures in one-to-one correspondence; each of the first bonding structures is provided with a core obstructing structure, which is used for obstructing overflow of conductive particles in an anisotropic conductive film.

Exemplarily, please refer to FIG. 2, which is a flow chart of the manufacturing method of a touch panel provided by an embodiment of the present disclosure. The method can comprise the following steps.

In step 501, a plurality of touch electrodes and a plurality of original bonding structures are formed on the first base substrate.

Optionally, the original bonding structures are bonding structures on which no core obstructing structure is provided. The original bonding structures can include a first indium tin oxide layer, a metal layer and a second indium tin oxide layer.

Figure 13:
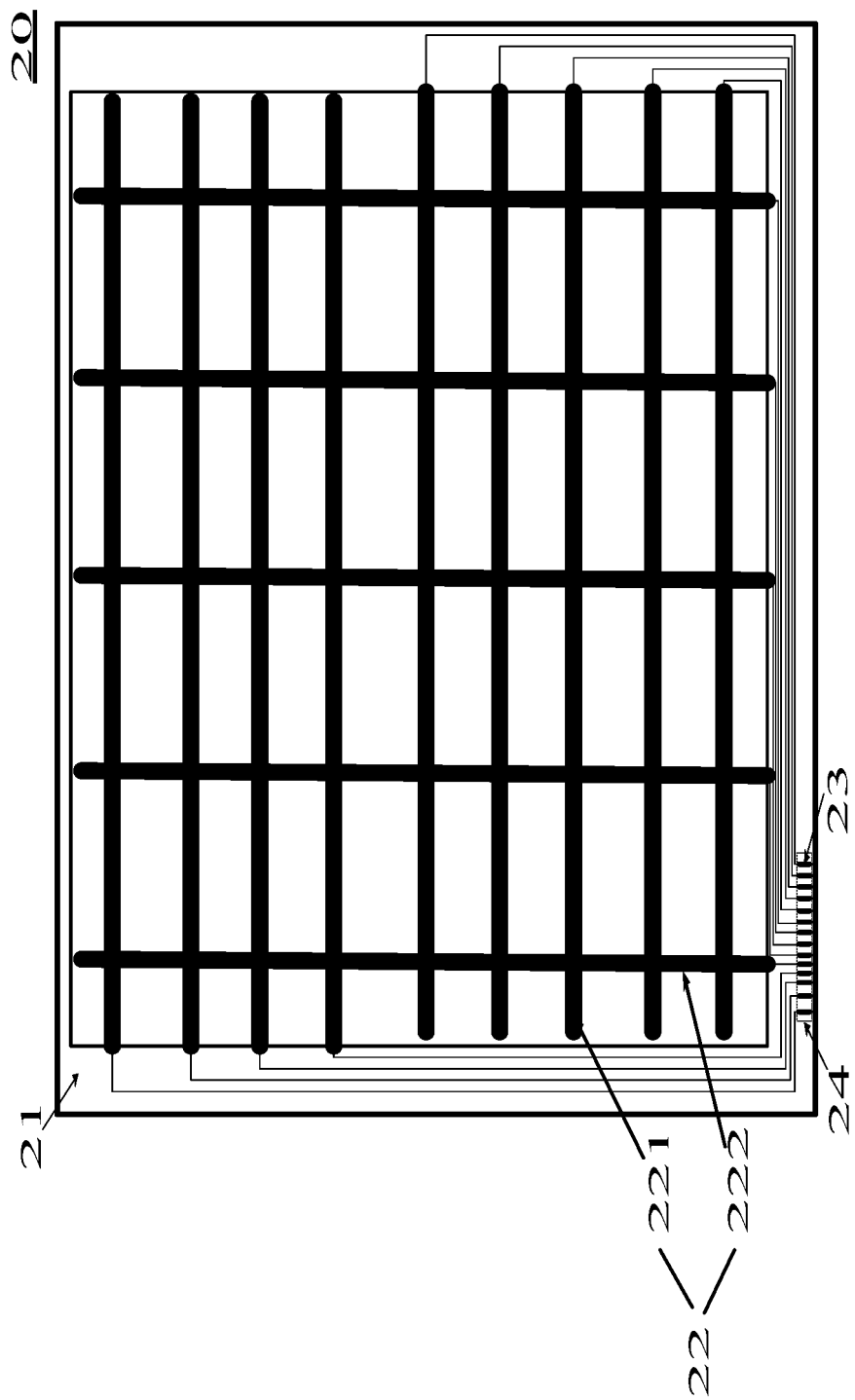
FIG. 13 is a flow chart of a method of forming a plurality of touch electrodes and a plurality of original bonding structures according to an embodiment of the present disclosure.

Exemplarily, please refer to FIG. 13, which is a flow chart of the method of forming a plurality of touch electrodes and a plurality of original bonding structures as provided by the embodiment of the present disclosure. The method can comprise the following working procedures.

In step 5011, a first touch electrode pattern is formed on the first base substrate.

The first touch electrode pattern can include a touch sensing electrode and a first indium tin oxide layer. Optionally, the material of the first touch electrode pattern can be indium tin oxide.

Exemplarily, an indium tin oxide thin film can be formed on the first base substrate by any of a variety of ways, such as deposition, coating and sputtering, etc., and then a first touch electrode pattern is formed by processing the indium tin oxide thin film with a one-time patterning technology, which can include photoresist coating, exposure, development, etching and photoresist peeling.

In step 5012, a wiring pattern and an insulating layer are formed in sequence on the first touch electrode pattern.

The wiring pattern can include a signal wire and a metal layer. Optionally, the material of the wiring pattern can be a metal.

Exemplarily, a metal thin film can be formed on the first touch electrode pattern by any of a variety of ways, such as deposition, coating and sputtering, etc., and then a wiring pattern is formed by processing the metal thin film with the one-time patterning technology, which can include photoresist coating, exposure, development, etching and photoresist peeling. After that, an insulating layer thin film is formed on the wiring pattern by any of a variety of ways, such as deposition, coating, sputtering, etc., and then an insulating layer is formed by processing the insulating layer thin film with the one-time patterning technology, which can include photoresist coating, exposure, development, etching and photoresist peeling.

In step 5013, a second touch electrode pattern is formed on the insulating layer.

The second touch electrode pattern can include a touch drive electrode and a second indium tin oxide layer. Optionally, the material of the second touch electrode pattern can be indium tin oxide.

Exemplarily, an indium tin oxide thin film can be formed on the insulating layer by any of a variety of ways, such as deposition, coating and sputtering, etc., and then a second touch electrode pattern is formed by processing the indium tin oxide thin film with the one-time patterning technology, which can include photoresist coating, exposure, development, etching and photoresist peeling.

It should be noted that the touch sensing electrode formed in the step 5011 can be connected with the signal wire formed in the step 5012, and the signal wire formed in the step 5012 can be connected with the touch drive electrode formed in the step 5013.

Figure 12:
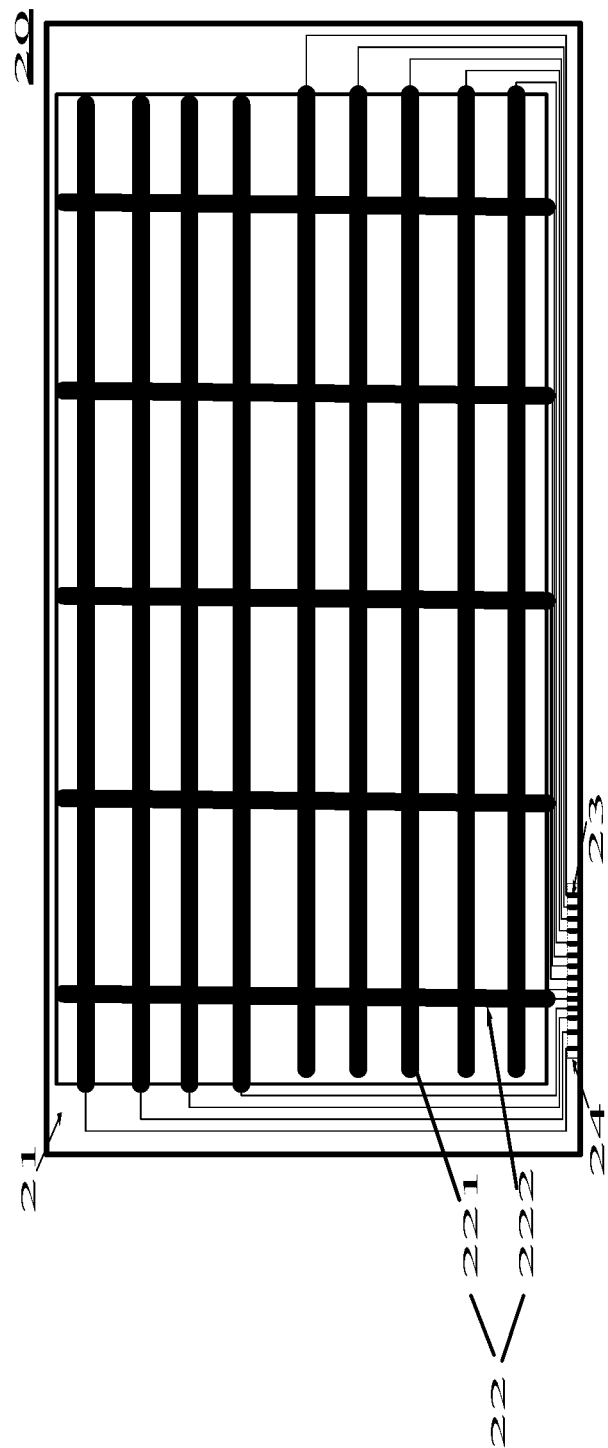
FIG. 12 is a flow chart of a method for manufacturing a touch panel according to an embodiment of the present disclosure.

Return to FIG. 12 again. As shown in FIG. 12, in the step 502, the plurality of original bonding structures are processed by using the one-time patterning technology to form the plurality of first bonding structures.

In the embodiment of the present disclosure, the first bonding structures with core obstructing structures can be formed by processing the original bonding structures with the one-time patterning technology. The core obstructing structure has a lot of implementations, thus different masks can be employed to process the original bonding structures with the patterning technology, so as to obtain a core obstructing structure of a pore-like structure 12a as shown in FIG. 8 or a core obstructing structure of a protruding structure 12b as shown in FIG. 11.

In summary, with the method for manufacturing the touch panel provided by the embodiment of the present disclosure, the core obstructing structure is provided on each of the first bonding structures in the touch panel. When the first bonding structure is connected to the first FPC by the ACF, under the reaction temperature of the ACF, after a pressure is applied to the first FPC, the core obstructing structure provided on the first bonding structure can obstruct overflow of the conductive particles in the ACF. Thus, the length of the first bonding structure can be reduced, allowing the first bonding area formed by the first bonding structure to have a smaller width. Consequently, after the display device is formed, an overall width of the frame of the display device can be reduced effectively. Moreover, the width of the first bonding structure and the gap between every two adjacent first bonding structures can also be reduced, thus the amount of ACF used subsequently can be reduced, and the width of the first FPC can be decreased, and thereby the costs for manufacturing the display device can be reduced effectively.

Figure 14:
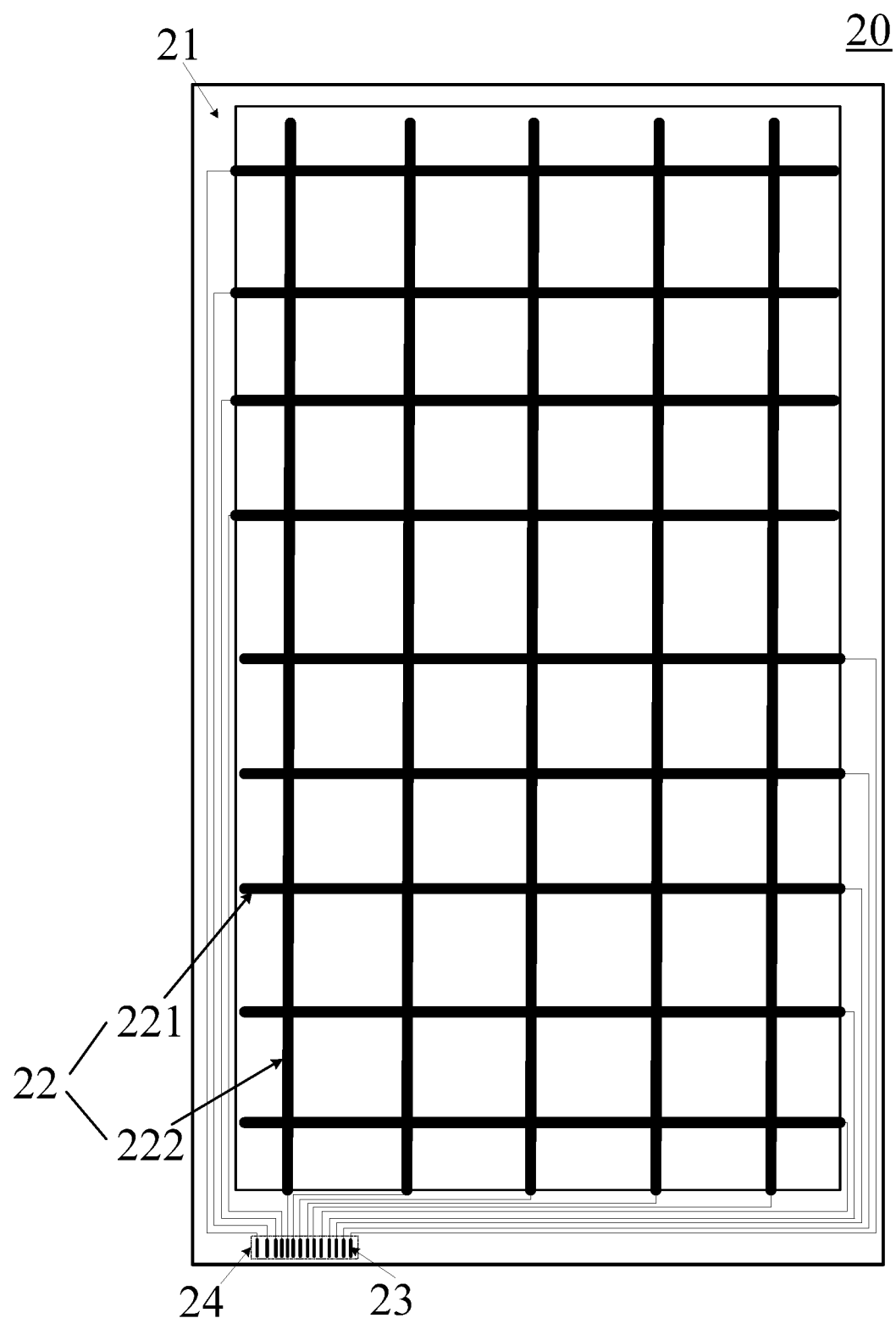
FIG. 14 is a schematic diagram of a structure of an array substrate according to an embodiment of the present disclosure.

In the second aspect, when the function panel is an array substrate, please refer to FIG. 14. FIG. 14 is a schematic diagram of a structure of an array substrate 20 provided by an embodiment of the present disclosure. The array substrate 20 can include: a second base substrate 21.

A plurality of signal lines 22 and a plurality of first bonding structures 23 are provided on the second base substrate 21, the plurality of signal lines 21 being connected with the plurality of first bonding structures 23 in one-to-one correspondence. The plurality of second bonding structures 23 can form a second bonding area 24, and the signal lines 22 can include gate lines 221 and data lines 222.

Each of second bonding structures 23 is provided with a core obstructing structure (not shown in FIG. 14), which is used for obstructing overflow of the conductive particles in the anisotropic conductive film.

In the embodiment of the present disclosure, the core obstructing structure provided on the second bonding structure has many implementations, and the embodiment of the present disclosure makes an illustrative description by taking the following two implementations as examples.

In the first implementation, the core obstructing structure in each of second bonding structures can include a plurality of pore-like structures provided in the second bonding structure, each of which has a width smaller than a diameter of the conductive particle. Optionally, the width of each pore-like structure is equal to one third of the diameter of the conductive particle.

In the second implementation, the core obstructing structure in each of second bonding structures can include protruding structures provided at two sides of the second bonding structure, the protruding structure having a height smaller than a diameter of the conductive particle. Optionally, the height of the protruding structure is equal to one third of the diameter of the conductive particle.

It should be noted that the second bonding structure in the array substrate is similar to the first bonding structure in the touch panel, thus reference can be made to the corresponding contents in the embodiment of the touch panel for the principle that the length and width of the second bonding structure in the array substrate and the gap between every two adjacent second bonding structures are allowed to be smaller, and the embodiment of the disclosure will not give a description thereof any more.

In the embodiment of the present disclosure, the signal lines and the second bonding structures in the array substrate can be generated simultaneously. Since the signal lines can include data lines and data lines, a part of the second bonding structures can be generated at the same time when the gate lines are generated, and the other part of the second bonding structures can be generated at the same time when the data lines are generated. In addition, since the material of the gates lines and data lines is a metal, the material of the second bonding structure is also a metal.

In summary, according to the array substrate provided by the embodiment of the present disclosure, the core obstructing structure is provided on each of second bonding structures in the array substrate. When the second bonding structure is connected to the second FPC by the ACF, under the reaction temperature of the ACF, after a pressure is applied to the second FPC, the core obstructing structure provided on the second bonding structure can obstruct overflow of the conductive particles in the ACF. Thus, the length of the second bonding structure can be reduced, allowing the second bonding area formed by the second bonding structure to have a smaller width. Consequently, after the display device is formed, an overall width of the frame of the display device can be reduced effectively. Moreover, the width of the second bonding structure and the gap between every two adjacent second bonding structures can also be reduced, thus the amount of ACF used subsequently can be reduced, and the width of the second FPC can be decreased, and thereby the costs for manufacturing the display device can be reduced effectively.

The embodiments of the present disclosure also provide a manufacturing method of the array substrate, which can include the following steps.

A plurality of signal lines and a plurality of second bonding structures are formed on the second base substrate.

The plurality of signal lines are connected with the plurality of second bonding structures in one-to-one correspondence. Each of second bonding structures is provided with a core obstructing structure, which is used for obstructing overflow of conductive particles in an anisotropic conductive film.

Exemplarily, the manufacturing method of the array substrate can include the following steps.

In step A, a gate pattern, a gate insulating layer, an active layer pattern, a source drain pattern, a passivation layer and a pixel electrode pattern are formed in sequence on the second base substrate. The source drain pattern can include a plurality of signal lines and a plurality of original bonding structures.

Optionally, the material of the source drain pattern can be a metal.

Exemplarily, the gate pattern, gate insulating layer and active layer pattern can be formed in sequence on the second base substrate; then a metal thin film is formed on a base substrate on which the active layer pattern is formed, and the source drain pattern is formed by processing the metal thin film with the one-time patterning technology, which can include: photoresist coating, exposure, development, etching and photoresist peeling; and at last the passivation layer and the pixel electrode pattern are formed in sequence on the source drain pattern.

In step B, the plurality of original bonding structures are processed with the one-time patterning technology to form the plurality of second bonding structures.

In the embodiment of the present disclosure, the second bonding structures with core obstructing structures can be formed by processing the original bonding structures with the one-time patterning technology. Reference can be made to the corresponding contents in the above embodiment of the manufacturing method of the touch panel for the specific principle thereof, and the embodiment of the present disclosure will not give a description thereof any more.

In summary, according to the method for manufacturing the array substrate provided by the embodiment of the present disclosure, the core obstructing structure is provided on each of second bonding structures in the array substrate. When the second bonding structure is connected to the second FPC by the ACF, under the reaction temperature of the ACF, after a pressure is applied to the second FPC, the core obstructing structure provided on the second bonding structure can obstruct overflow of the conductive particles in the ACF. Thus, the length of the second bonding structure can be reduced, allowing the second bonding area formed by the second bonding structure to have a smaller width. Consequently, after the display device is formed, an overall width of the frame of the display device can be reduced effectively. Moreover, the width of the second bonding structure and the gap between every two adjacent second bonding structures can also be reduced, thus the amount of ACF used subsequently can be reduced, and the width of the second FPC can be decreased, and thereby the costs for manufacturing the display device can be reduced effectively.

The embodiments of the present disclosure further provide a display device, which can include a function panel, an FPC and an ACF. The function panel can be a touch panel as shown in FIG. 6, and can also be an array substrate as shown in FIG. 10. The array substrate can form a display panel, which can be a liquid crystal display panel or an organic light-emitting diode (referred to as OLED) display panel. The display panel and the touch panel are disposed one on the other in sequence.

Optionally, if the display device only has a display function, then the display device can include a function panel which can be an array substrate.

Optionally, if the display device has not only a display function but also a touch function, then the display device can include two function panels, which are respectively an array substrate and a display panel. Exemplarily, assume that the FPC connected to the touch panel is a first FPC, and the FPC connected to the array substrate is a second FPC, then the first bonding structure in the touch panel is connected to the first FPC by the ACF, and the second bonding structure in the array substrate is connected to the second FPC by the ACF.

In summary, the display device provided by the embodiment of the present disclosure provides the core obstructing structure on each of the first bonding structures in the touch panel and on each of second bonding structures in the display panel. When the first bonding structure is connected to the first FPC by the ACF, and the second bonding structure is connected to the second FPC by the ACF, the core obstructing structure can obstruct overflow of the conductive particles in the ACF. Thus, the length of the first bonding structure and the second bonding structure can be reduced. Consequently, after the display device is formed, an overall width of the frame of the display device can be reduced effectively.

Persons of ordinary skill in the art can understand that all or part of the steps described in the above embodiments can be completed through hardware, or through relevant hardware instructed by programs stored in a non-transitory computer readable storage medium, such as read-only memory, disk or CD, etc.

The foregoing are only exemplary embodiments of the present disclosure, and are not intended to limit the present disclosure. Within the spirit and principles of the disclosure, any modifications, equivalent substitutions, improvements, etc., are within the protection scope of appended claims of the present disclosure.

What is claimed is:

1. A function panel, comprising:
   a base substrate;
   a plurality of conductive structures and a plurality of bonding structures provided on the base substrate, the plurality of conductive structures being connected with the plurality of bonding structures in one-to-one correspondence; and
   a core obstructing structure provided on each of the bonding structures, which comprises a plurality of pore-like structures in an array and is configured to obstruct overflow of conductive particles in an anisotropic conductive film,
   wherein the width of each of the pore-like structures is equal to one third of the diameter of the conductive particle.

2. The function panel according to claim 1, wherein the pore-like structures are blind holes.

3. The function panel according to claim 1, wherein the core obstructing structure comprises: protruding structures provided at two sides of the bonding structures, a height of the protruding structure being smaller than a diameter of the conductive particle.

4. The function panel according to claim 3, wherein the height of the protruding structure is equal to one third of the diameter of the conductive particle.

5. The function panel according to claim 3, wherein,
   each of the bonding structures comprises: a first indium tin oxide layer, a metal layer and a second indium tin oxide layer which are stacked in sequence; and
   the protruding structures are provided at two sides of the second indium tin oxide layer.

6. The function panel according to claim 1, wherein when the function panel is a touch panel, the plurality of conductive structures are a plurality of touch electrodes, which are connected with the plurality of bonding structures in one-to-one correspondence.

7. The function panel according to claim 1, wherein when the function panel is an array substrate, the plurality of conductive structures are a plurality of signal lines, which are connected with the plurality of bonding structures in one-to-one correspondence.

8. The function panel according to claim 1, wherein,
   each of the bonding structures comprises: a first indium tin oxide layer, a metal layer and a second indium tin oxide layer which are stacked in sequence; and
   the metal layer is provided with a plurality of first via holes, the second indium tin oxide layer is provided with a plurality of second via holes, and the first via holes are communicated with the second via holes in one-to-one correspondence.

9. A manufacturing method of a function panel, comprising steps of:
   forming a plurality of conductive structures and a plurality of original bonding structures on a base substrate, and processing the plurality of original bonding structures using a one-time patterning technology to form the plurality of bonding structures, wherein the plurality of conductive structures are connected with the plurality of bonding structures in one-to-one correspondence; and
   providing a core obstructing structure for obstructing overflow of conductive particles in an anisotropic conductive film on each of the bonding structures, wherein the core obstructing structure comprises a plurality of pore-like structures in an array, and the width of each of the pore-like structures is equal to one third of the diameter of the conductive particle.

10. The method according to claim 9, wherein the core obstructing structure comprises: protruding structures provided at two sides of the bonding structure;
    and wherein a height of the protruding structure is smaller than a diameter of the conductive particle.

11. The method according to claim 9, wherein
    when the function panel is a touch panel, the plurality of conductive structures are a plurality of touch electrodes, which are connected with the plurality of bonding structures in one-to-one correspondence.

12. The method according to claim 9, wherein
    when the function panel is an array substrate, the plurality of conductive structures are a plurality of signal lines, which are connected with the plurality of bonding structures in one-to-one correspondence.

13. A display device, comprising:
    a function panel, a flexible circuit board and an anisotropic conductive film,
    wherein the function panel comprises:
    a base substrate;
    a plurality of conductive structures and a plurality of bonding structures provided on the base substrate, the plurality of conductive structures being connected with the plurality of bonding structures in one-to-one correspondence; and
    a core obstructing structure provided on each of the bonding structures, which comprises a plurality of pore-like structures in an array and is configured for obstructing overflow of conductive particles in an anisotropic conductive film, wherein
    the width of each of the pore-like structures is equal to one third of the diameter of the conductive particle, and
    the bonding structures in the function panel are connected to the flexible circuit board by the anisotropic conductive film.

14. The display device according to claim 13, wherein the pore-like structures are blind holes.

15. The display device according to claim 13, wherein the core obstructing structure comprises: protruding structures provided at two sides of the bonding structure, a height of the protruding structure being smaller than a diameter of the conductive particle.

16. The display device according to claim 15, wherein the height of the protruding structure is equal to one third of the diameter of the conductive particle.

17. The display device according to claim 13, wherein when the function panel is a touch panel, the plurality of conductive structures are a plurality of touch electrodes, which are connected with the plurality of bonding structures in one-to-one correspondence.

18. The display device according to claim 13, wherein when the function panel is an array substrate, the plurality of conductive structures are a plurality of signal lines, which are connected with the plurality of bonding structures in one-to-one correspondence.

19. The display device according to claim 13, wherein,
each of the bonding structures comprises: a first indium tin oxide layer, a metal layer and a second indium tin oxide layer which are stacked in sequence; and
the metal layer is provided with a plurality of first via holes, the second indium tin oxide layer is provided with a plurality of second via holes, and the first via holes are communicated with the second via holes in one-to-one correspondence.

20. The display device according to claim 19, wherein,
each of the bonding structures comprises: a first indium tin oxide layer, a metal layer and a second indium tin oxide layer which are stacked in sequence; and
the protruding structures are provided at two sides of the second indium tin oxide layer.

* * * * *